United States Patent [19]

Ohsawa et al.

[11] Patent Number: 5,813,819
[45] Date of Patent: Sep. 29, 1998

[54] SUBSTRATE TRANSFER APPARATUS, AND METHOD OF TRANSFERRING SUBSTRATES

[75] Inventors: Tetu Ohsawa, Sagamihara; Kiyohisa Tateyama, Kumamoto, both of Japan

[73] Assignee: Tokyo Electron Limited, Tokyo, Japan

[21] Appl. No.: 833,424

[22] Filed: Apr. 7, 1997

Related U.S. Application Data

[62] Division of Ser. No. 455,662, May 31, 1995, Pat. No. 5,645,391, which is a continuation of Ser. No. 71,269, Jun. 4, 1993, abandoned.

[30] Foreign Application Priority Data

Jun. 5, 1992 [JP] Japan .................................. 4-169891
Jun. 11, 1992 [JP] Japan .................................. 4-175940

[51] Int. Cl.⁶ .................................................. B65G 49/07
[52] U.S. Cl. ............................................. 414/416; 901/47
[58] Field of Search .................................. 414/274, 275, 414/280, 416, 936, 937; 901/47

[56] References Cited

U.S. PATENT DOCUMENTS

| | | | |
|---|---|---|---|
| 4,044,377 | 8/1977 | Bowerman | 901/47 X |
| 4,280,137 | 7/1981 | Ashida et al. | 901/47 X |
| 4,412,121 | 10/1983 | Kremers et al. | 901/47 X |
| 4,458,152 | 7/1984 | Bonora | 414/937 X |
| 4,652,204 | 3/1987 | Arnett | 901/47 X |
| 4,718,023 | 1/1988 | Arora | 901/46 X |
| 4,744,709 | 5/1988 | Hertel et al. | 901/46 X |
| 4,770,590 | 9/1988 | Hugues et al. | 901/47 X |
| 4,836,733 | 6/1989 | Hertel et al. | 414/416 X |
| 4,911,597 | 3/1990 | Maydan et al. | 901/47 X |
| 4,941,800 | 7/1990 | Koike et al. | 414/280 X |
| 5,017,082 | 5/1991 | Kobayashi | 901/35 X |
| 5,044,752 | 9/1991 | Thurfjell et al. | 414/416 X |
| 5,133,635 | 7/1992 | Malin et al. | 414/416 X |
| 5,162,047 | 11/1992 | Wada et al. | 414/416 X |
| 5,277,539 | 1/1994 | Matsui et al. | 414/416 X |
| 5,303,034 | 4/1994 | Carmichael et al. | 414/274 X |
| 5,350,269 | 9/1994 | Azuma et al. | 414/416 |
| 5,405,230 | 4/1995 | Ono et al. | 414/936 X |
| 5,520,501 | 5/1996 | Kouno et al. | 901/47 X |

FOREIGN PATENT DOCUMENTS

| | | | |
|---|---|---|---|
| 2051237 | 3/1987 | Japan | 414/936 |
| 3232348 | 9/1988 | Japan | 414/936 |
| 0184047 | 7/1990 | Japan | 414/936 |
| 5178407 | 7/1993 | Japan | 414/936 |
| WO 92/05920 | 4/1992 | WIPO . | |

*Primary Examiner*—James W. Keenan
*Attorney, Agent, or Firm*—Oblon, Spivak, McClelland, Maier & Neustadt, P.C.

[57] ABSTRACT

In a vertical heat treatment apparatus, a transfer apparatus is used to transfer a wafer between a wafer carrier and a wafer boat. The transfer apparatus comprises a base unit, a fork, three non-contact type sensors, and a main controller. The base unit can move between a first position at which to transfer the wafer to and from the wafer carrier and a second position at which to transfer the wafer to and from the wafer boat. The fork can move back and forth with respect to the base unit, for supporting the wafer. The non-contact type sensors are mounted on the fork, for detecting the position of the wafer. The main controller controls the base unit and the fork in accordance with the data detected by the non-contact type sensors. Another embodiment utilizes a monitor camera in place of the sensors to monitor and display the movement of the fork relative to the wafer.

12 Claims, 10 Drawing Sheets

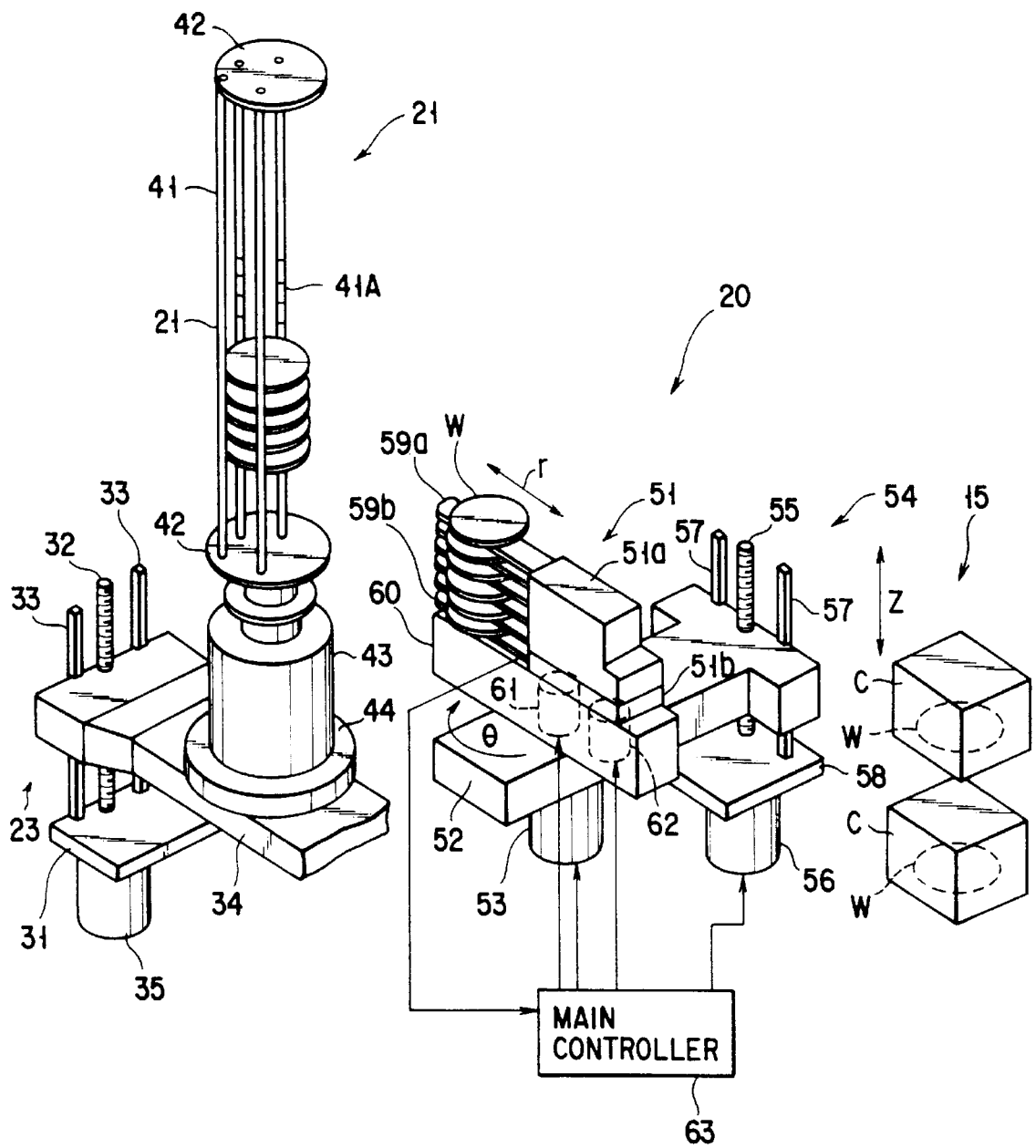
F I G. 3

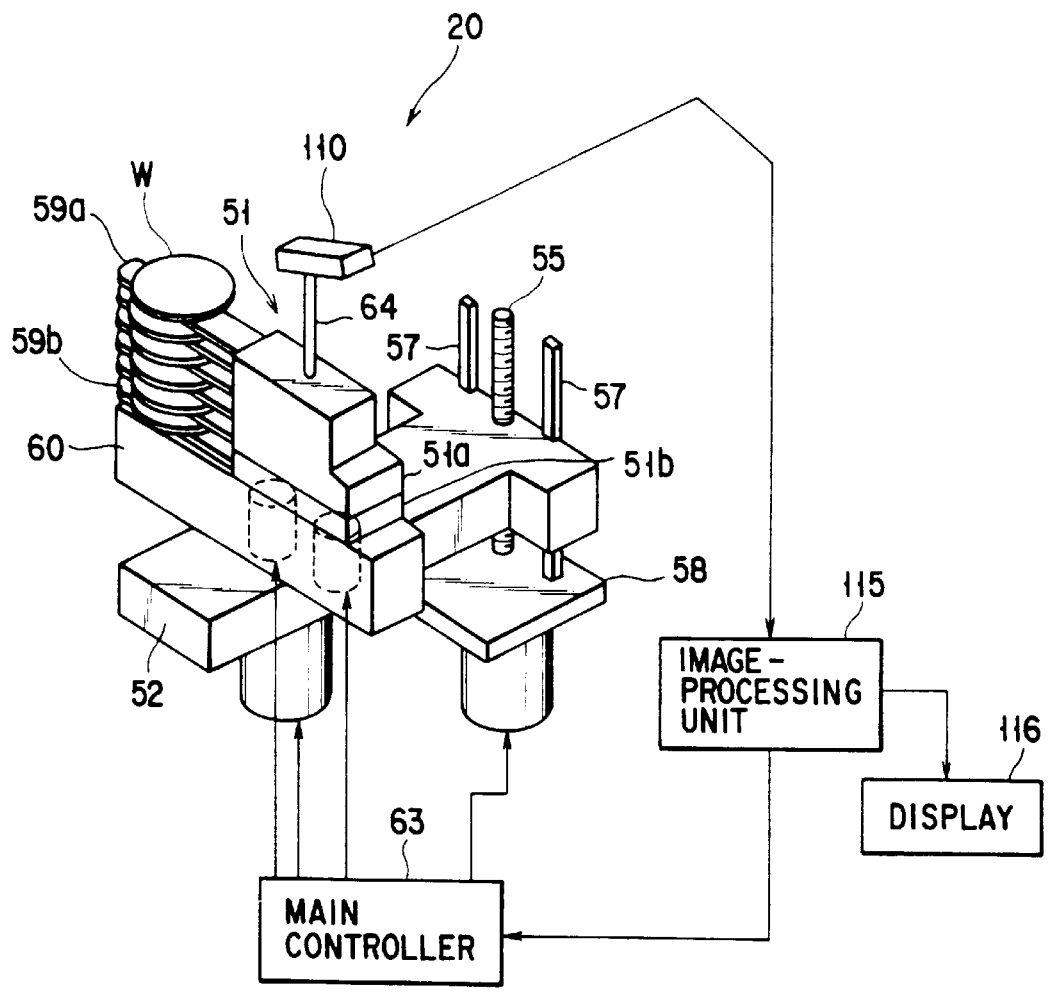
F I G. 13
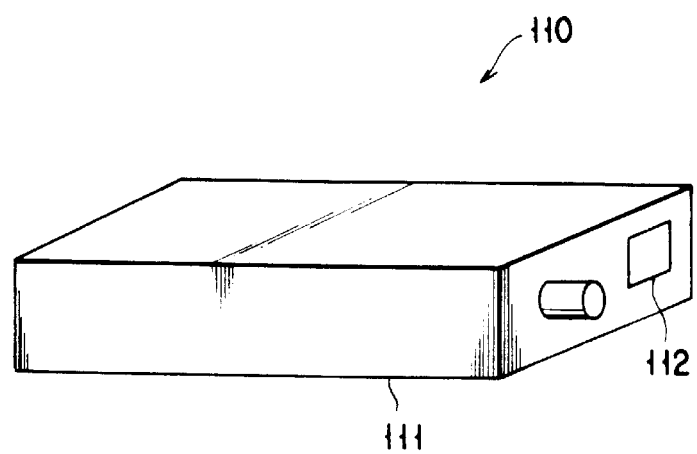
F I G. 14

SUBSTRATE TRANSFER APPARATUS, AND METHOD OF TRANSFERRING SUBSTRATES

This is a Division, of application Ser. No.08/455,662, filed on May 31, 1995, now U.S. Pat. No. 5,645,391, which is a continuation of Ser. No. 08/071,269 filed on Jun. 4, 1993, abandoned.

BACKGROUND OF THE INVENTION

1. Field of the Invention

The present invention relates to an apparatus for transferring substrates such as semiconductor wafers, and also a method of transferring substrates.

2. Description of the Related Art

A process of manufacturing semiconductor devices includes a step of performing heat treatment on a substrate such as a semiconductor wafer. Recently, a heat treatment apparatus designed to process a large number of wafers in a batch is employed to perform the heat treatment. The apparatus has a processing vessel in which wafers will be heat-treated. To be heat-treated, the wafers are transferred from a wafer carrier made of resin (e.g., Teflon™) onto a wafer boat made of quartz or fused silica. The wafer boat containing the wafers is loaded into the processing vessel. In the processing vessel, the wafers are heat-treated. After the heat treatment, the wafer boat containing the wafers is unloaded from the reaction chamber, and the heat-treated wafers are transferred back into the carrier.

The wafers are transferred from the wafer carrier onto the wafer boat, and vice versa, by means of a transfer apparatus located between the wafer wafer carrier and the wafer boat. The transfer apparatus has a base unit and forks, for supporting a wafer. The base unit is moved up and down and rotated in the horizontal plane, thereby being set at a position where a transfer operation can be performed. The forks are moved back and forth in the horizontal plane with respect to the base unit. The base unit and the forks are moved in accordance with patterns previously set in a control mechanism. The wafers are transferred in accordance with above movements of the base unit and the forks.

In the actual transfer operation, the forks must take appropriate positions with respect to the wafer carrier, the wafer boat, and the wafers.

However, the wafer carrier or the wafer boat does not always take the same position or assume the same attitude. Nor do the wafer-supporting grooves of the carrier or the boat remain in the same condition at all times. Actually, the carrier and the boat may be inclined, displaced, or deformed. The boat may be deformed due to the heat it received during the heat treatment, or may be deformed while being washed to remove contaminant adhered to it during the heat treatment. Further, the wafer boat having inherent displacement may be replaced by another one. Still further, the wafer carrier is likely to be deformed either partly or entirely since it is made of resin.

If the wafer carrier or the wafer boat is displaced, or if the wafers are inappropriately arranged in the carrier or boat, the forks fail to transfer the wafer between the carrier and the boat in a desired manner since the operating positions of the forks of the transfer apparatus controlled in accordance with basic operating patterns are in improper positions with respect to the wafers. More precisely, the forks can neither support the wafer in a desirable position or attitude, nor precisely insert the wafer into the groove of the target wafer-support (the boat or the carrier) or into any wafer-support groove at all. Consequently, the wafer may fall from the forks and be broken, or may abut on the next one, inevitably damaging the same. In the worst possible case, the forks may hit and topple the wafer boat.

Therefore, when a new wafer support, i.e., a wafer boat or a wafer carrier, is installed in place of the one hitherto used, the operating pattern of the transfer apparatus must be adjusted, (the adjustment is called teaching), so that it may transfer wafers appropriately from and onto the new wafer support. Conventionally, the teaching is performed by a skilled operator.

Hitherto, the teaching is performed as follows. The operator enters the heat treatment apparatus incorporating the transfer apparatus, and minutely moves the body of the apparatus and the forks, on a trial-and-error basis, while visually confirming the vertical movement, swinging, and horizontal movement of each fork, so that each form may assume a position sufficiently appropriate with respect to the wafer support at any time during the wafer-transferring operation.

The results of the teaching largely depends on the skill and experience of the operator, and are not reproducible in most cases. Further, the wafer support is not always identical in size to others of the same type. Still further, the wafer-supporting grooves of the wafer support are usually displaced from their desirable positions. Inevitably, the teaching requires much labor and much time on the part of the operator, and can hardly achieve reliable adjustment of the operation pattern of the transfer apparatus.

Most heat treatment apparatuses for performing heat treatment on a batch of semiconductor wafers are small and have many components arranged in a limited space. The operator cannot have an easy access into them. Inevitably it would be difficult for the operator to perform the teaching of the transfer apparatus which is incorporated in the heat treatment apparatus. When the heat treatment apparatus is accessed by the operator, its interior may likely be contaminated.

The basic operating pattern of the transfer apparatus may have some displacement from the proper operation. In this case, even if the actual displacement is small, the transfer apparatus fails to operate in the predetermined pattern if other undesirable situations take place in the heat treatment apparatus or if the forks or the wafer support hold wafers in an improper manner. As a consequence, the wafers or the forks may be damaged in some cases. It remains unknown until the wafer or the forks are damaged that an inappropriate operating pattern has been set for the transfer apparatus.

SUMMARY OF THE INVENTION

An object of the present invention is to provide a substrate transfer apparatus which can transfer substrates with high reliability, while determining whether a substrate is at an appropriate position.

Another object of the invention is to provide a method of transporting substrate with high reliability.

In a first aspect of the invention, there is provided an apparatus for transferring substrates between a first substrate support and a second substrate support, comprising: a base unit capable of moving between a first position at which to transfer a substrate to and from the first substrate support and a second position at which to transfer the substrate to and from the second substrate support; a substrate-supporting member capable of moving back and forth with respect to the base unit, for supporting the substrate; and a noncontact type sensor mounted on the substrate-supporting member, for detecting the position of the substrate.

In a second aspect of the invention, there is provided an apparatus for transferring substrates between a first substrate support and a second substrate support, comprising: a base unit capable of moving between a first position at which to transfer a substrate to and from the first substrate support and a second position at which to transfer the substrate to and from the second substrate support; a substrate-supporting member capable of moving back and forth with respect to the base unit, for supporting the substrate; and monitor means for monitoring the transfer of the wafer performed by said substrate-supporting member.

In a third aspect of the invention, there is provided a method of transferring substrate between a first substrate support and a second substrate support, comprising the steps of: inserting a substrate-supporting member into the first substrate support; determining a positional relation between the substrate-supporting member and a substrate to be transported; determining whether the positional relation detected falls within a predetermined tolerance; placing the substrate on the substrate-supporting member when the positional relation falls within the predetermined tolerance; and transferring the substrate from the substrate-supporting member onto the second substrate support.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view explaining how a transfer apparatus according to a first embodiment of the invention transfers a wafer between a wafer carrier and a wafer boat;

FIG. 13 is a perspective view showing a transfer apparatus according to a second embodiment of the present invention;

FIG. 14 is a perspective view of the monitor camera incorporated in the second embodiment;

DETAILED DESCRIPTION OF THE PREFERRED EMBODIMENTS

With reference to the accompanying drawings an embodiment of the present invention will be described in detail. This embodiment is designed to transfer a semi-conductor wafer used as a substrate. In the embodiment, a wafer boat and a wafer carrier are used as substrate supports.

Figure 1:
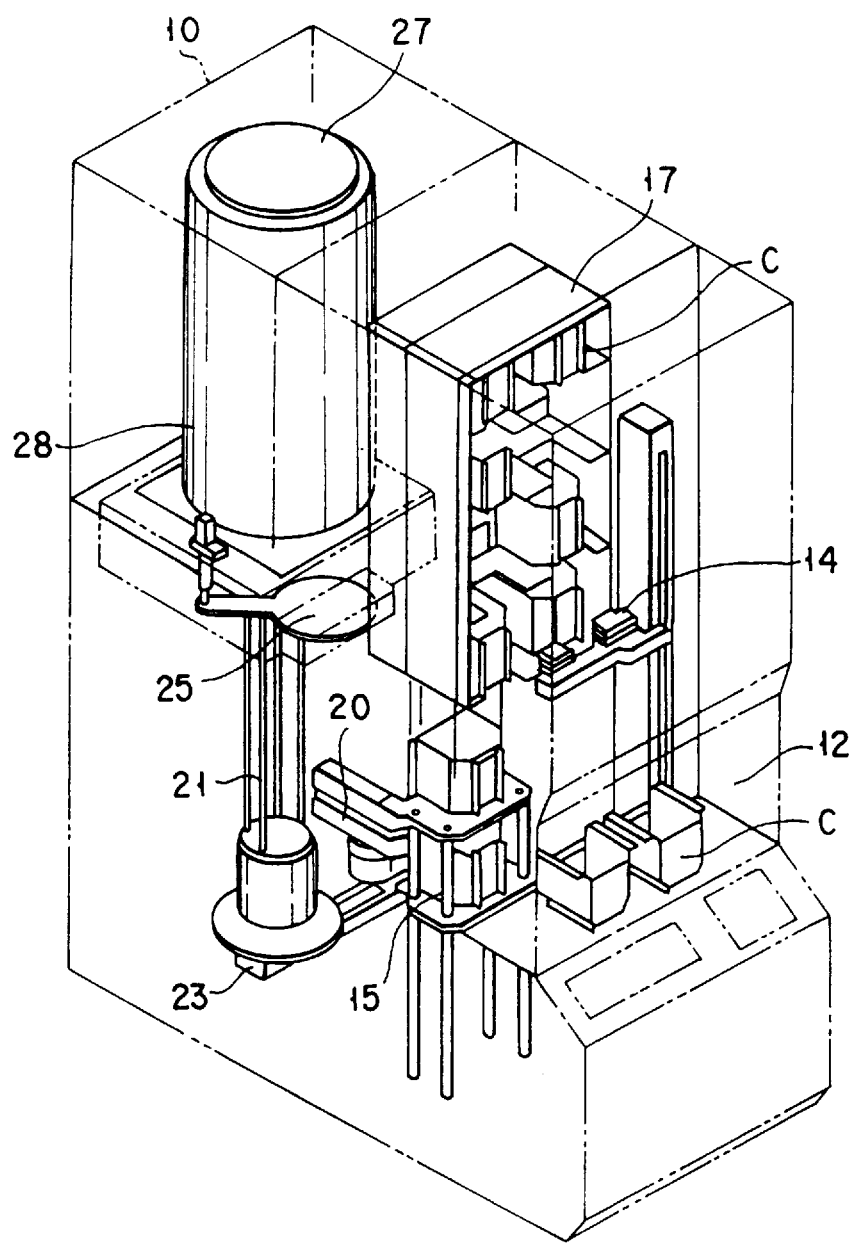
FIG. 1 is a perspective view showing a heat treatment apparatus to which the present invention is applied.
Figure 2:
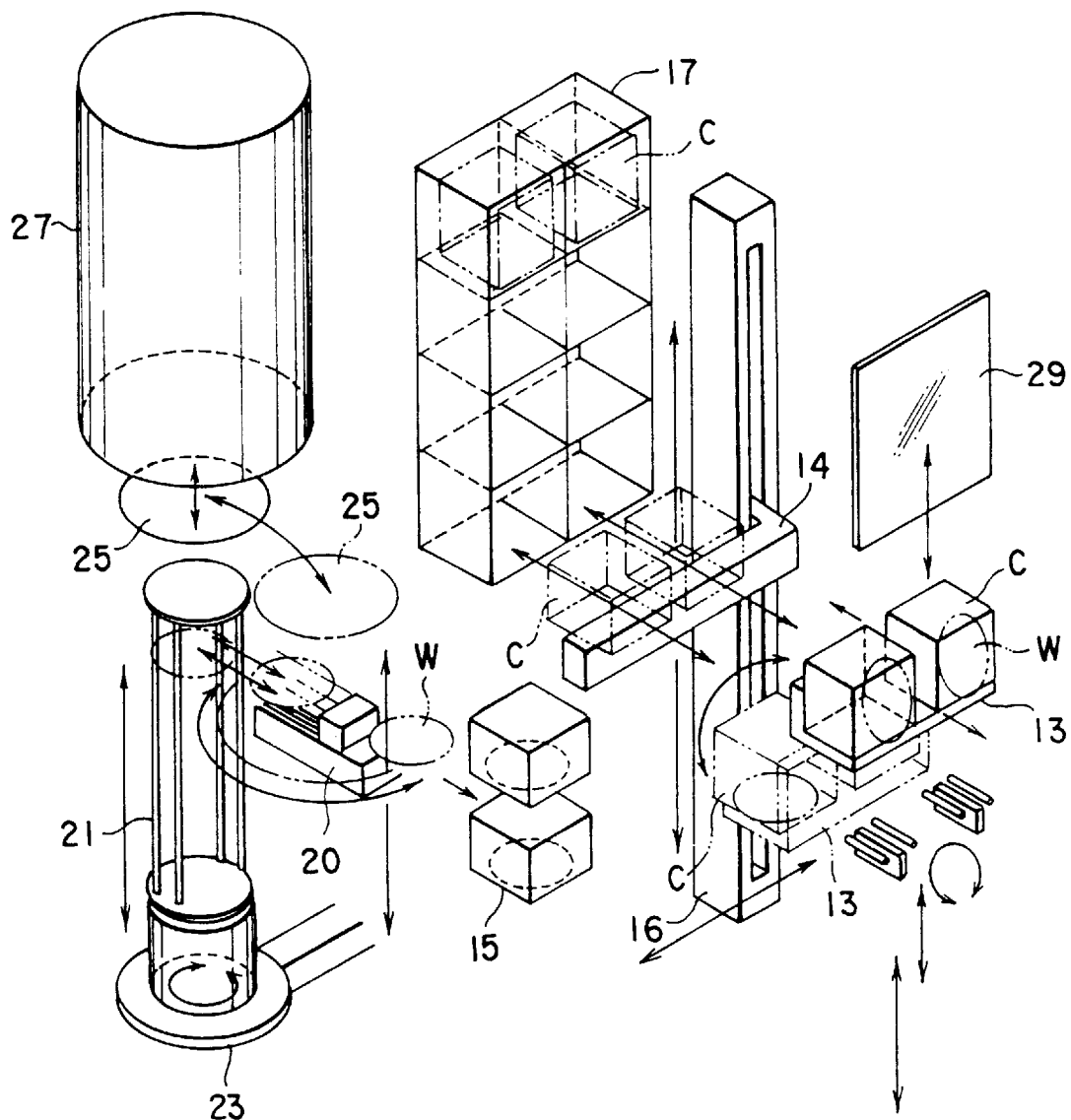
FIG. 2 is a perspective view explaining how a semiconductor wafer is transferred in the heat treatment apparatus shown in FIG. 1.

FIG. 1 shows a heat treatment apparatus 10 to which the present invention is applied. FIG. 2 is a diagram for explaining how a semiconductor wafer is transferred in the heat treatment apparatus.

As shown in FIG. 1, the heat treatment apparatus 10 comprises a processing vessel 27 for heat-treating wafers, a boat elevator 23 for transporting a wafer boat 21 supporting wafers into and from the vessel 27, a carrier receptacle 17 for storing a wafer carrier C containing wafers, and a transfer apparatus 20 for transferring wafers between the wafer boat 21 and the wafer carrier C.

The carrier C containing, for example, 25 wafers W, is mounted on an wafer-orientation changing mechanism 13 at an outlet 12 having an automatic door 29. The mechanism 13 rotates the carrier C by 90°. The carrier C is moved onto a transfer stage 15 by a carrier transfer mechanism 14. Alternatively, the carrier C is loaded into the carrier receptacle 17 by a carrier elevator 16. Thereafter, the wafers W are transferred from the carrier C to the wafer boat 21 by means of the transfer apparatus 20.

After a predetermined number of wafers W have been transferred to the wafer boat 21, the boat elevator 23 moves the wafer boat 21 upwards. A cap 25 is opened which is located at the lower end of the reaction vessel 27. The wafer boat 21 is inserted into the vessel 27, and the cap 25 is closed. In the vessel 27, the wafers W are treated with the heat applied from a heater 28 (only shown in FIG. 1).

Thereafter, the cap 25 is opened, the wafer boat 21 is removed from the vessel 27 and lowered to its initial position by means of the boat elevator 23. The transfer apparatus 20 transfers the wafers W, one by one, from the boat 21 to the wafer carrier C mounted on the transfer stage 15.

FIG. 3 is a perspective view for explaining how the apparatus 20 transfers the wafers W between the wafer carrier C and the wafer boat 21. As shown in this figure, the transfer apparatus 20 is located between the wafer carrier C placed on the transfer stage 15 and the wafer boat 21 mounted on the boat elevator 23.

As shown in FIG. 3, the boat elevator 23 comprises a table 34 for supporting the boat 21, a ball screw 32 set in screw engagement with the table 34 and extending vertically, an electric motor 35 for rotating the ball screw 32, two linear guides 33 guiding the table 34, and a plate 31 holding the linear guides 33. When the motor 35 rotates the ball screw 32, the table 34 is lifted or lowered along the linear guides 33. The wafer boat 21, which is mounted on the table 34, is thereby loaded into the processing vessel 27 or unloaded therefrom.

The wafer boat 21 is made of material, e.g., quartz or fused silica, which excels in heat resistance and corrosion resistance. It comprises four poles 41, a pair of disks 42 supporting the poles 41 at their ends, a heat-insulating cylinder 43 mounted on the lower surface of the lower disk 42, and a flange 44 connected to the lower end of the cylinder 43. Each pole 41 has 100 to 150 grooves 41A spaced apart equidistantly. The grooves 41A have an opening width of 2 mm for 8-inch wafers having a thickness of 0.725 mm, or an opening width of 1.5 mm for 6-inch wafers having a thickness of 0.65 mm.

When the wafer boat 21 is loaded into the processing vessel 27, the flange 44 contacts the flange of a manifold (not shown). The interior of the vessel 27 is thereby sealed.

As FIG. 3 shows, the transfer apparatus 20 comprises an arm section 51, a table 52, an electric motor 53, and a drive mechanism 54. The arm section 51 is used to hold wafers W. The table 52 supports the arm section 51, such that the arm section 51 can be rotated by the motor 53 in the direction of arrow θ in a horizontal plane. The mechanism 54 is designed to move the table 52 up and down.

The drive mechanism 54 comprises a ball screw 55 set in screw engagement with the table 52 and extending vertically, an electric motor 56 for rotating the ball screw 55, two linear guides 57 guiding the table 52, and a plate 58 holding the linear guides 57. When the motor 56 rotates the ball screw 55, the table 52 is moved in Z direction, that is, up and down along the linear guides 57.

The arm section 51 comprises an upper arm 51a, a lower arm 51b, and a base 60. The upper arm 51a is mounted on the lower arm 51b, which in turn is placed on the base 60. The base 60 is mounted on the table 52. The upper arm 51a has five forks 59a extending horizontally. The lower arm 51b has one fork 59b extending horizontally. The base 60 contains two electric motors 61 and 62. The motor 61 is used to drive the forks 59a back and forth as indicated by arrows r, and the motor 62 to drive the the fork 59b back and forth as indicated by arrows r. The forks 59a and the fork 59b function as supports for holding the wafers W and transferring them between the wafer carrier C and the wafer boat 21.

As has been described, the table 52 can move in the Z direction, the arm section 51 can rotate in the direction of arrow θ, and the forks 59a and 59b can moved back and forth as shown by arrows r. Therefore, the transfer apparatus 20 can transfer wafers W between the wafer carrier C and the wafer boat 21 even if the carrier C and the boat 21 are displaced from the desired positions.

The forks 59a and the form 59b each have a non-contact type sensor, described in further detail hereinafter. The signals output by the sensors are supplied to a main controller 63. The main controller 63 processes these signals and generates control signals. The control signals are supplied to the electric motors 53, 56, 61, and 62 which are incorporated in the transfer apparatus 20.

Figure 4:
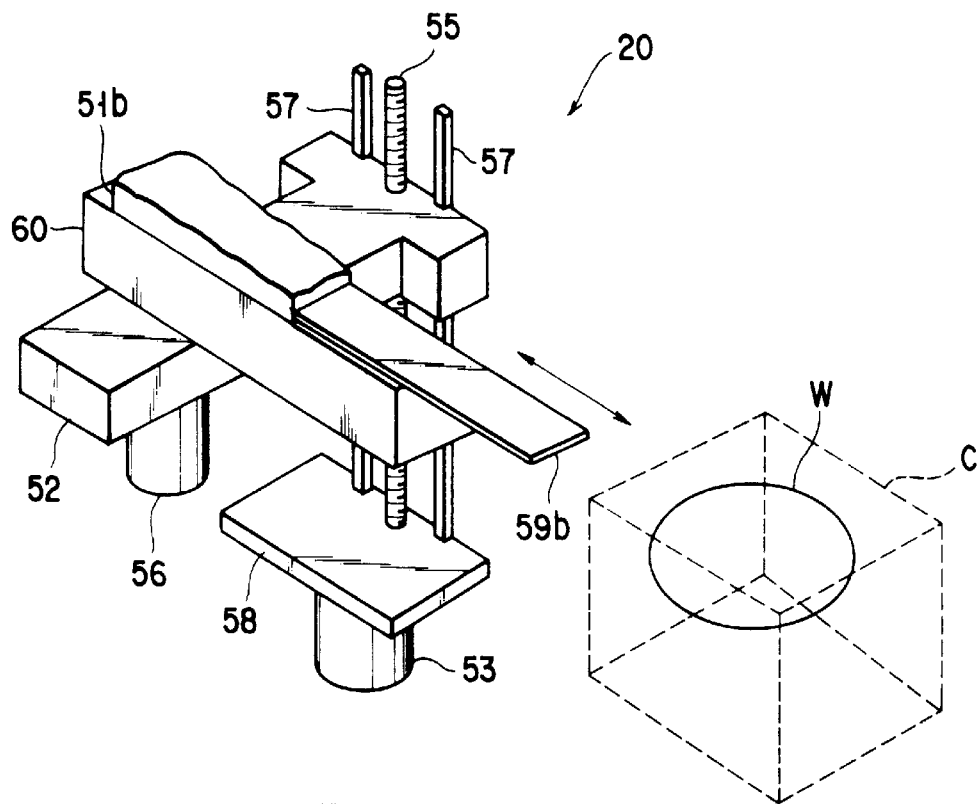
FIG. 4 is a perspective view explaining how the first embodiment transfers a wafer from a wafer carrier.
Figure 5:
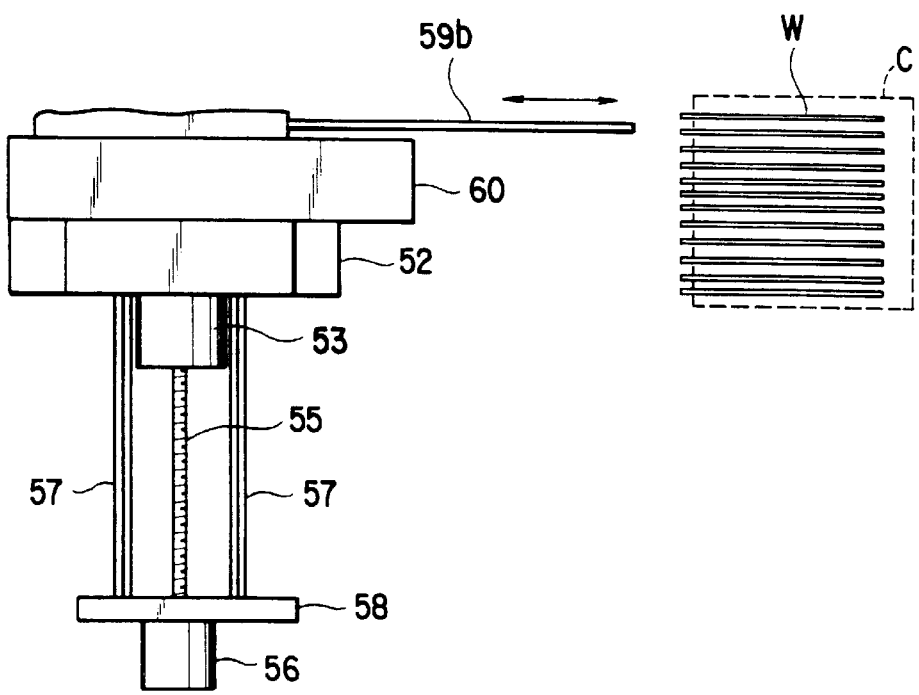
FIG. 5 is a side view explaining how the first embodiment transfers a wafer from a wafer boat.

With reference to FIGS. 4 and 5, it will be explained how the fork 59b of the apparatus 20 is driven to transfer a wafer W from the wafer carrier C. The other forks 59a are operated exactly in the same way as the fork 59b, and how they are driven will not be described for the sake of simplicity.

First, the electric motor 56 of the drive mechanism 54 is rotated, thereby moving the table 52 in the Z direction to a desired position. Next, the motor 53 is driven, rotating the arm section 51 in the direction of arrow θ until the forks 59a and the fork 59b come to oppose the wafer carrier C. The motor 62 is rotated, moving the fork 59b forward and inserting the same into the space below the target wafer W contained in the wafer carrier C. After the wafer W is placed on the fork 59a, the motor 62 is rotated in the opposite direction, moving the fork 59b backward, whereby the wafer W is removed from the carrier C.

Figure 6:
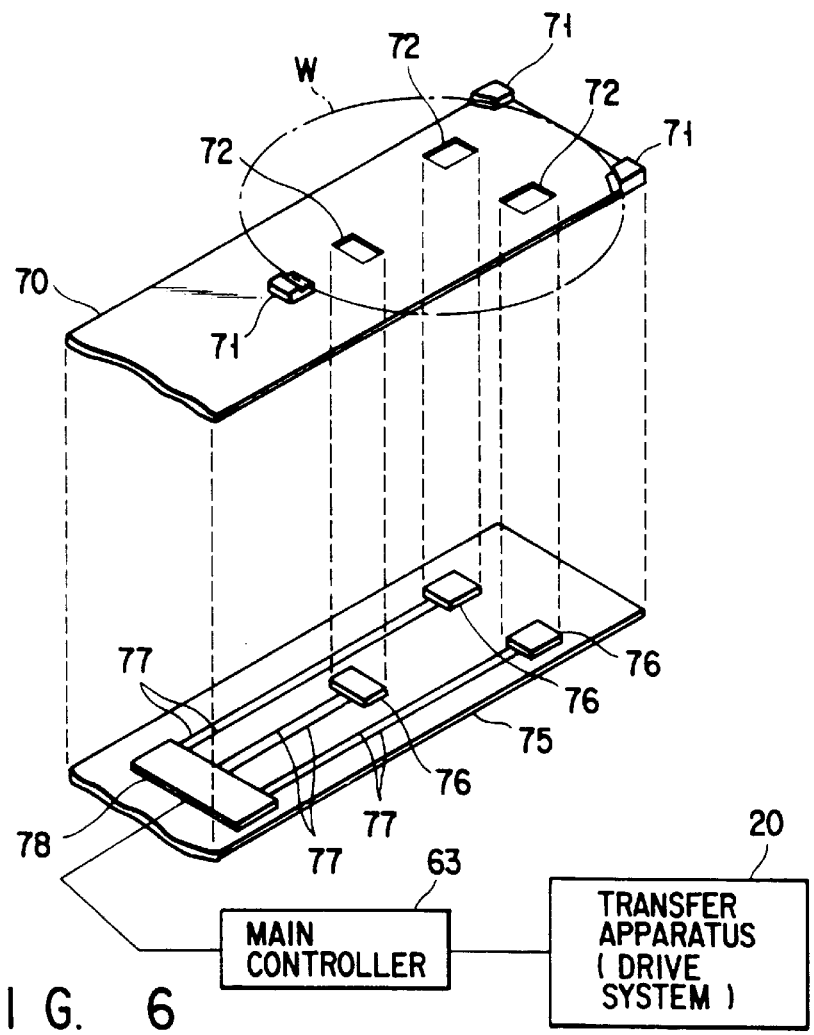
FIG. 6 is an exploded view of one of the forks used in the first embodiment.
Figure 7:
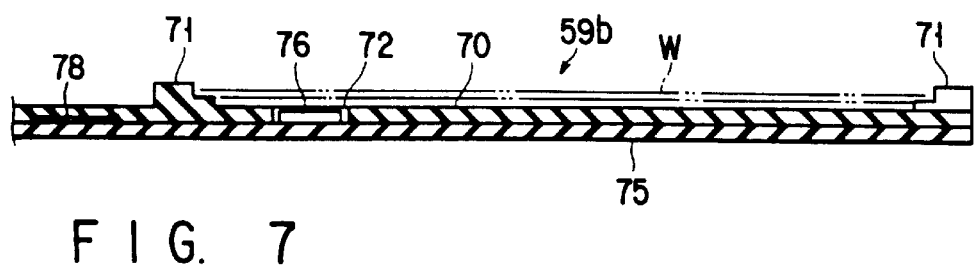
FIG. 7 is a sectional view of the fork.

With reference to FIGS. 6 and 7, the fork 59b will be described in detail. The other forks 59a are completely identical in structure to the fork 59b.

FIG. 6 is an exploded view of the fork 59b, and FIG. 7 is a sectional view thereof. As is shown in these figures, the fork 59b comprises an upper plate 70 and a lower plate 75 connected to the upper plate 70. The upper plate 70 is made of alumina or silicon carbide. The lower plate 75 is a flexible, electrically insulating plate. Three wafer-supporting pads 71 are mounted on the upper surface of the plate 70, with their tops positioned in the same horizontal plane, which is a little higher than the upper surface of the plate 70. The plate 70 has three rectangular through holes 72 made in the part on which a wafer W will be placed. Two of these holes 72 are located near the distal end of the plate 70 and spaced apart from each other along the width thereof. The third hole 72 is located farther from the distal end of plate 70 and in the axis thereof. The three holes 72 are close to the wafer-supporting pads 71, respectively.

Mounted on the upper surface of the lower plate 75 are three ultrasonic sensors 76. The sensors 76 are fitted in the through holes 72 of the upper plate 70, respectively, and exposed at the upper surface of the plate 70. The sensors 76 are connected by wirings 77 printed on the upper surface of the lower plate 75 to a sensor controller 78 which is formed on the proximal end portion of the plate 75 and which is made of a flexible printed circuit (FPC).

Figure 8:
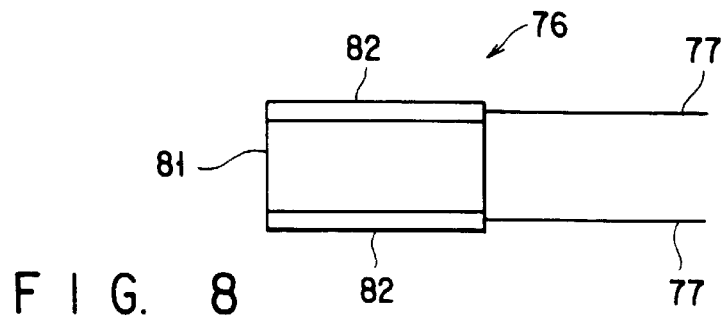
FIG. 8 is a schematic representation of the non-contact type detector used in the first embodiment.

As is shown in FIG. 8, each of the ultrasonic sensors 76 comprises, for example, a piezoelectric element 81 and two electrodes 82 sandwiching the element 81. When excited by the sensor controller 78, the piezoelectric element 81 generates ultrasonic waves. The waves are applied upward through the hole 72 to the lower surface of the wafer W supported on the wafer-supporting pads 71. The lower surface of the wafer W reflects the waves back to the ultrasonic sensor 76. The reflected ultrasonic waves influence the operating condition of the sensor 76 such that a phase difference occurs between the operating voltage and current of the sensor 76. This phase difference indicates the presence of the wafer W on the fork 59b. When no reflected ultrasonic wave is detected, indicates absence of the wafer on the fork 59b. The value of the phase difference is proportional to the distance between the sensor 76 and the lower surface of the wafer W. Hence, the distance can be determined from the phase difference between the operating voltage and current of the sensor 76.

Each of the ultrasonic sensors 76 can detect the presence or absence of not only the wafer W supported by the fork 59b. But also can it detect the presence or absence of any other wafer W positioned above the fork 59b and the distance between this wafer W and the sensor 76.

Since three sensors 76 are arranged at different positions on the fork 59b, it is possible to determine how much the wafer W is inclined in which direction, by comparing the distances between the sensors 76 and the lower surface of the wafer W. If the distances detected by the three sensors 76 are equal, the wafer W is found to extend parallel to the fork 59b. If these distances are different, the wafer W is found to incline to the fork 59b, and how much it inclines in which direction can be determined from the differences among the three distances. The accuracy of the inclination of the wafer W, thus determined, is high since the ultrasonic sensors 76 are located near the wafer-supporting pads 71, respectively.

Each of the ultrasonic sensors 76 generates a signal which represents the phase difference between the operating voltage and current of the sensor 76. The signals output by the sensors 76 are input to a main controller 63 through the sensor controller 78. The main controller 63 processes the input signals, producing control signals. As described above, the control signals are supplied to the electric motors 53, 56, 61, and 62, all incorporated in the transfer apparatus 20.

The upper plate 70 and lower plate 75 of the fork 59b are fastened together, either by bolts or adhesive. The sensors 76 are not so thick as to abut on the lower surface of the wafer W. They should not protrude from the through holes 72, or should be spaced away from the lower surface of the wafer W if they protrude from the holes 72. The fork 59b can be as thin as 2 mm or less. The distance between the upper surface of each sensor 76 and the lower surface of the wafer W is set at about 0.2 to 0.3 mm.

Figure 9:
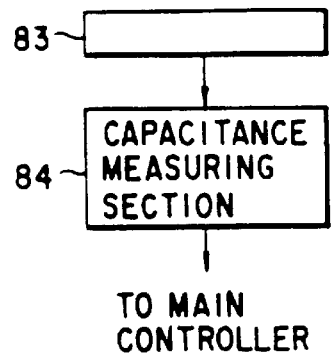
FIG. 9 is a schematic representation of another non-contact type detector which can be used in the first embodiment.

The ultrasonic sensors 76, which are non-contact type sensors, may be replaced by an electrostatic capacitance sensors. FIG. 9 illustrates such an electrostatic capacitance sensor. As shown in this figure, the capacitance sensor comprises a sensor chip 83 and a capacitance measuring section 84. The chip 83 and the section 84 cooperate to detect the changes in the electrostatic capacitance between the wafer W and the chip 83. The position of the wafer W can be determined from the capacitance change detected. The section 84 generates a signal which represents the change in the electrostatic capacitance. The signal is input to the main controller 63.

Figure 10:
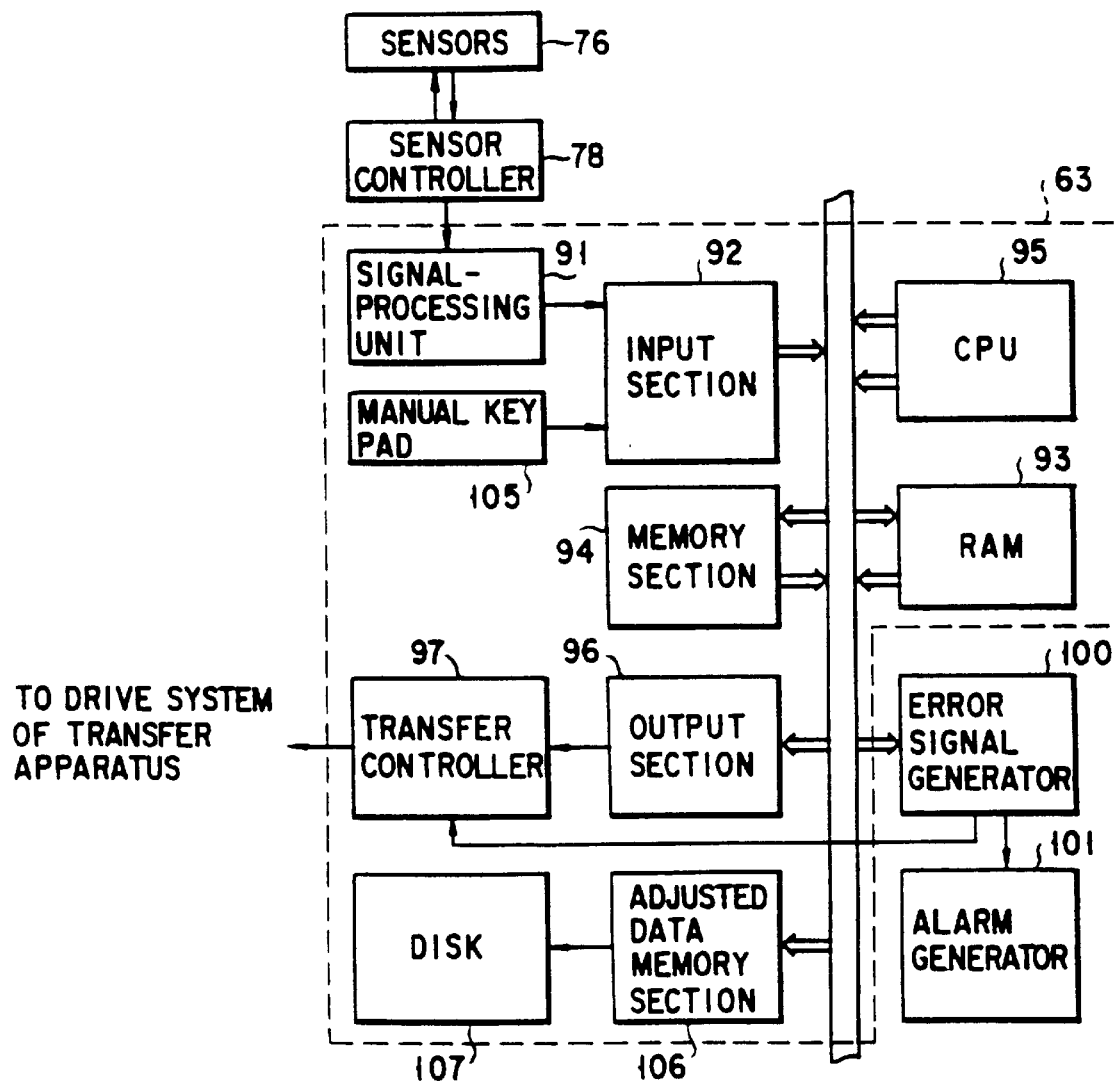
FIG. 10 is block diagram illustrating the main controller used in first embodiment, for controlling some other components of the first embodiment in accordance with the data output by the sensor.

The main controller 63 is designed to generate signals for controlling the movement of the transfer apparatus 20, by processing the signals which the sensors 76 have output and which represent the presence or absence of a wafer W, the distance between the wafer W and each sensor 76, and the inclination of the wafer W. The main controller 63 will be described in detail, with reference to FIG. 10.

In the main controller 63, a signal-processing unit 91 receives the signals output from the sensor controller 78 and supplies these signals to an input section 92. The data represented by the signals (hereinafter called "detected data") is written from the input section 92 into a RAM 93. The reference data stored in a memory section 94 is also written into the RAM 93, too. The reference data of the transfer apparatus 20 with respect to the wafer W in the basic operation pattern of the apparatus 20 is stored in a memory section 94. The detected data and the reference data, both stored in the RAM 93, are input to a CPU 95. The CPU 95 performs a computing operation using the detected data and the reference data, thereby determining whether or not the forks 59a and the fork 59b are operating in the prescribed operating pattern. If the CPU 95 determines that the forks 59a and 59b are moved in the prescribed operating pattern, an operation proceeding signal is supplied to an output section 96 and hence to a transfer controller 97. In response to the operation proceeding signal the transfer controller 97 generates control signals, which are supplied to the motors 53, 56, 61, and 62 of the transfer apparatus 20. The apparatus 20 thereby continues to operate in the prescribed pattern (basic operation pattern).

In the case where the CPU 95 fails to determine whether or not the forks 59a and the fork 59b are moved in the prescribed pattern, the CPU 95 reset the computing operation by its resetting mechanism.

The CPU 95 may find that the difference between the detected data and the reference data is unacceptable, determining that the forks 59a and 59b are not moved in the prescribed operating pattern. In other words, any fork is greatly displaced from the wafer W to be supported by it, or any wafer W assumes an undesirable position with respect to the fork. If this is the case, an error signal generator 100 produces an error signal. The error signal is supplied to the transfer controller 97, and a stopping signal is sent to the motors of the transfer apparatus 20. As a result, the transfer apparatus 20 stops operating. The error signal is supplied to an alarm generator 101, too. In response to the error signal the alarm generator 101 generates an alarm. Perceiving the alarm, an operator knows that any fork is greatly displaced from the wafer W to be supported by it, or that any wafer support (the wafer carrier or boat) or any wafer W assumes an undesirable position with respect to the fork. The operator looks into the heat treatment apparatus 10 to see whether any fork, any wafer support or any wafer is displaced. If any fork is displaced, the operator move it to the desired position. If any wafer support or any wafer is displaced, the operator move it to the desired position.

As described above, when the operation of the transfer apparatus 20 deviates from the prescribed pattern due to a malfunction of the apparatus 20 or the undesirable supporting of a wafer W, the operator can understand that the apparatus 20 fails to operated in the prescribed pattern or that an accident may happen because of the failure of the apparatus 20. Hence, the operator can take measures necessary to prevent an accident.

The operator may find that the prescribed operating is pattern for the transfer apparatus 20 is erroneous, inevitably displaying the forks 59a and/or the fork 59b. In this case, the operator operates a manual key pad 105. The key pad 105 comprises fork-positioning keys and a data-storing key.

First, the operator pushes the fork-positioning keys, thus inputting data showing an adjusted position of the forks 59a and/or the 59b to the input section 92. The CPU 95 performs a computing operation using the adjusted position data and the reference data stored in the memory section 94, determining whether or not the forks 59a and 59b are operating in the prescribed operating pattern. If the CPU 95 determines that the forks 59a and 59b are moved in the prescribed operating pattern an operation proceeding signal is supplied to the output section 96 and hence to the transfer controller 97, which generates control signals in accordance with the adjusted position data. The control signals drives the motors 53, 56, 61, and 62 of the transfer apparatus 20.

Then, the operator pushes the data-storing key of the manual key pad 105. The adjusted position data is thereby stored into an adjusted data memory section 106. The adjusted position data, now stored in the memory section 106, corrects the reference data stored in the memory section 94. Both the adjusted position data and the the corrected reference data are recorded on a disk 107 with is separatable, if necessary for future use.

If the CPU 95 finds that the adjusted position represented by the data input by pushing the fork-positioning keys falls outside the predetermined tolerance, the operator pushes the fork-positioning keys again, inputting new data showing a different adjusted position for the forks 59a and/or the fork 59b.

Figure 11:
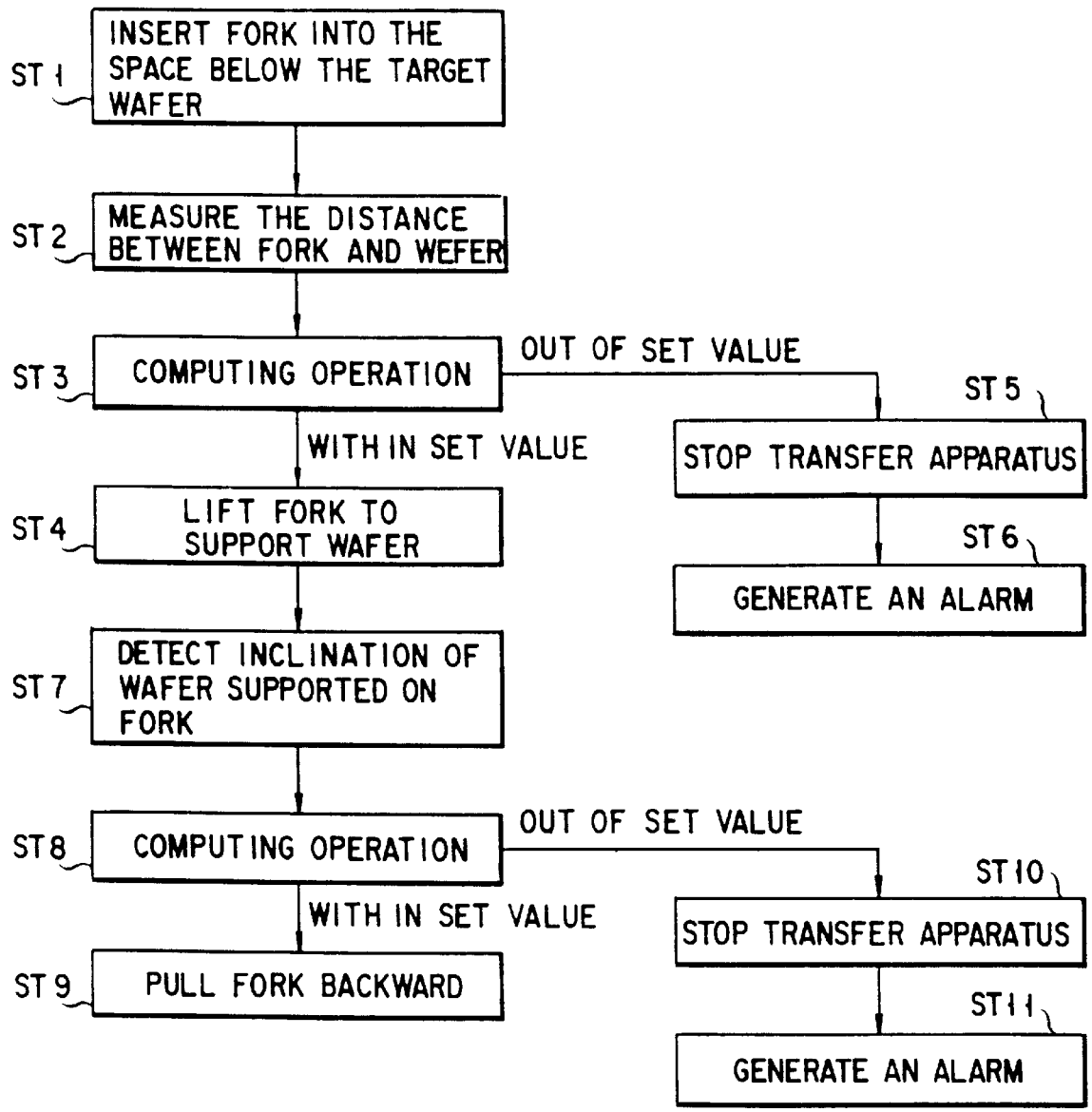
FIG. 11 is a flow chart explaining how the fist embodiment transfers a wafer from a wafer carrier.
Figure 12:
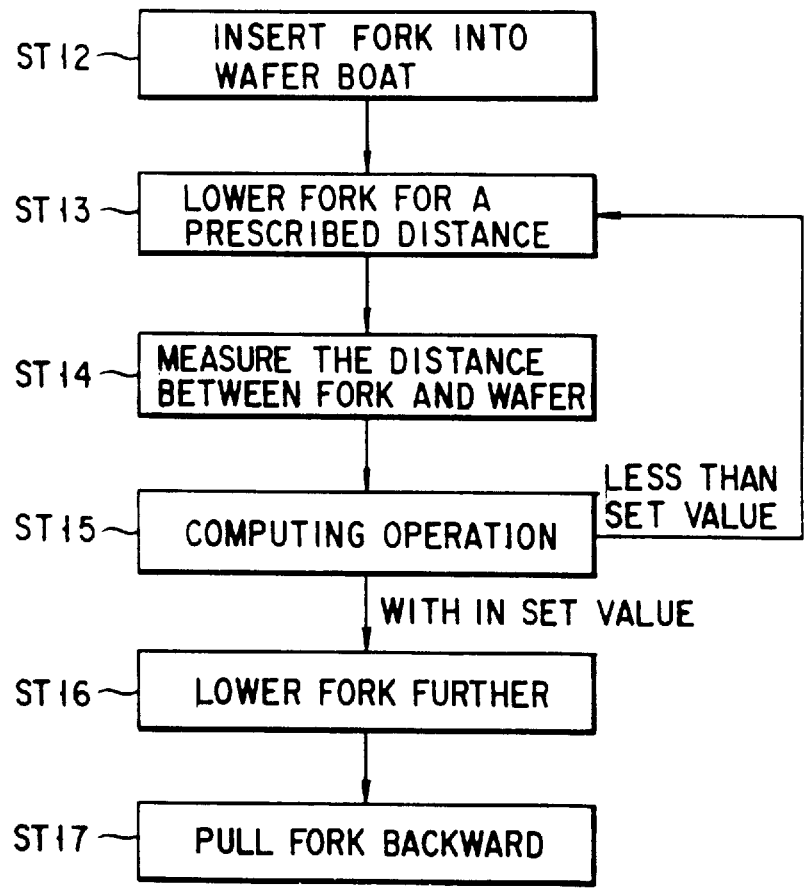
FIG. 12 is a flow chart explaining how the first embodiment transfers a wafer onto a wafer boat.

With reference to the flow chart of FIGS. 11 and 12, it will be explained how the transfer apparatus 20 is operated. In particular, it will be described how the fork 59b is moved to transfer a wafer W. The forks 59a are moved in the same way as the fork 59.

First, the arm section 51 is moved up or down in the Z direction in the prescribed basic operating pattern set in the main controller 63, until the fork 59b is placed at the adequate level for the target wafer W held in the carrier C (at the level slightly below the lower surface of the target wafer W). Next, the arm section 51 is rotated in the direction of arrow θ (FIG. 3) until its tip comes to oppose the carrier C, thus aligning the axis of the fork 59b with that of the carrier C. The fork 59b is moved forward into the space below the target wafer W (Step 1).

Then, the sensors 76 detect the distance between the fork 59b and the wafer W (Step 2). The main controller 63 performes a computing operation using the detected distance with the reference data, determining whether or not the distance falls within a predetermined tolerance (Step 3). It the detected distance falls within the predetermined tolerance the fork 59b is lifted until it supports the wafer W (Step 4). If the detected distance is out of the predetermined tolerance the main controller 63 stops the operation of the transfer apparatus 20 (Step 5). Then, the main controller 63 generates an alarm (Step 6). Perceiving the alarm, the operator makes necessary adjustments on the transfer apparatus 20. The apparatus 20 thereby continues to operate, performing Step 4—that is, the fork 59b is lifted until it supports the wafer W.

After Step 4, the three sensors 76 detect the inclination of the wafer W now supported on the fork 59b (Step 7). The main controller 63 performs computing operation using the detected inclination and the reference data, determining whether or not the inclination of the wafer W falls within a predetermined tolerance (Step 8). If the detected inclination falls within the predetermined tolerance, the fork 59b is pulled backward, thereby removing the target wafer W from the wafer carrier C (Step 9). If the detected inclination is out of the predetermined tolerance, the main controller 63 stops the operation of the transfer apparatus 20 (Step 10). Then, the main controller 63 generates an alarm (Step 11). Perceiving the alarm, the operator adjust the position of the wafer W, eliminating the inclination thereof. As a result, the apparatus 20 continues to operate, performing Step 9—that is, the fork 59b is pulled back, removing the target wafer W from the wafer carrier C.

After step 9, the arm section 51 is moved in the Z direction until the fork 59b is placed at the adequate level for the the groove 41A of the wafer boat 21. The arm section 51 is rotated until its tip comes to oppose the wafer boat 21, and the fork 59b is moved forward into the wafer boat 21 (Step 12). At this time the sensors 76 detect the presence of the wafer W on the fork 59b. Hence, it is confirmed that the wafer W has not fallen from the fork 59b and can therefore be transferred onto the wafer boat 21.

Then, the fork 59b is lowered for a prescribed distance (Step 13). The sensors 76 detects the distance between the fork 59b and the wafer W (Step 14). In Step ST15 the main controller 63 performs computing operation using the detected distance and a reference value, determining whether or not the detected distance falls within a predetermined tolerance (Step 15). If the detected distance is less than the reference value, the flow returns to Step 13. If the detected distance falls within the predetermined tolerance, fork 59b is lowered, leaving the wafer W in the groove 41A of the wafer boat 21 (Step 16). Thereafter, the fork 59b is pulled out of the wafer boat 21 (Step 17).

Steps 1 to 17 are repeated to move any one of the forks 59a in order to transfer a wafer W from the wafer carrier C to the wafer boat 21. The transfer apparatus 20 transfers the wafers W from the carrier C to the boat 21—first the uppermost wafer, then the second uppermost one, and finally the lowermost one.

During not only the step of placing the wafer W on each fork, but also the step of removing the wafer W from the carrier C and the step of inserting it into the boat 21, the sensors 76 serve to determine whether each of these steps is executed correctly and to confirm whether or not the next step can be performed. The sensors 76 also make it possible to determine whether or not any fork is moved in every step in accordance with the prescribed operating pattern. Hence, the transfer apparatus can transfer a wafer W from the carrier C to the boat 21 with high reliability in the desired pattern. For example, If the sensors 76 detect the absence of a wafer W on any fork before the fork is inserted into the carrier C, it is now possible to insert the fork into the wafer carrier C. If the sensors 76 detects the presence of a wafer W on the fork during the period between Step 9 (in which the fork 59b is pulled back, removing the target wafer W from the carrier C) and Step 12 (in which the arm section 51 is rotated, having its tip opposing the wafer boat 21), it is ascertained that the wafer W has not been fallen from the fork and that the transfer apparatus 20 can continue to operate. Further, if the sensors 76 detects the presence of a wafer W on the fork immediately before the fork is inserted into the space below the target wafer-supporting groove 41A of the boat 21, it is confirmed possible to insert the fork into the wafer boat 21. Also, if the sensors 76 detects the absence of a wafer W on the fork when the fork is pulled back out of the boat 21, it is now possible to insert the fork into the carrier C to remove another wafer C therefrom.

It should be noted that the transfer apparatus 20 can transfer a heat-treated wafer W from the wafer boat 21 to the carrier C in the same steps as those explained with reference to FIGS. 11 and 12.

Since the sensors 76 are ultrasonic sensors, they can be very thin. Therefore, each fork can be make sufficiently thin and easily moved, not adversely influencing the wafer W it supports. From the ultrasonic waves applies to the wafer W and reflected therefrom the distance between the fork and a wafer W can be measured in various methods other than by detecting the phase difference between the operating voltage and current of the ultrasonic sensor 76. For example, the distance can be measured from the changes in the operating voltage of the sensor 76, which have been caused by the ultrasonic wafers reflected from the wafer W and applied to the ultrasonic sensor 76. Also, an ultrasonic wave receiving element may be arranged, spaced apart from one sensor 76, in order to detect the distance between the fork and a wafer W. Further, each ultrasonic sensor 76 may be provided with a filter, if necessary.

If it suffices to detect only the presence or absence of a wafer W on each fork, the ultrasonic sensors 76 may be replaced by any other non-contact type sensors, such as optical sensors. To detect the distance between the fork and the wafer W and the inclination of the wafer W, as well as the presence or absence of the wafer W on the fork, however, ultrasonic sensors best serve the purpose. Only one sensor is sufficient in the case where the inclination of the wafer W need not be detected. Only two sensors may well serve the purpose of detecting the inclination of a wafer W, though the inclination measured is less accurate than if measured by using three sensors.

The positioning of the sensors 76 on the lower plate 75 of each fork is not particularly limited, provided that they are located in that part of the upper plate 70 on which a wafer W will be placed. Nonetheless, to obtain reliable inclination data, it is desirable that the sensors 76 be spaced part as much as possible.

A transfer apparatus, which is a second embodiment of the present invention, will be described with reference to FIGS. 13 to 16.

Figure 15:
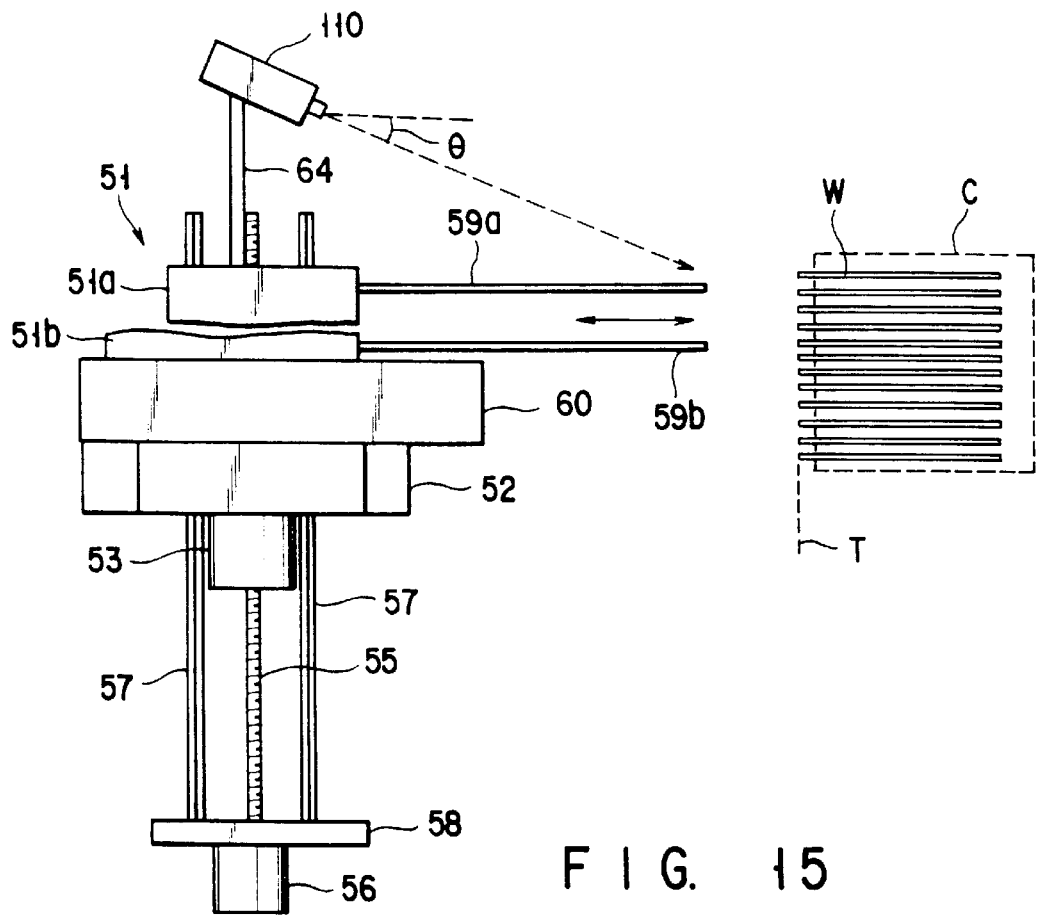
FIG. 15 is a side view explaining how the second embodiment transfers a wafer from a wafer carrier.

FIG. 13 is a perspective view showing the second embodiment. As can be understood from this figure, the transfer apparatus is basically the same as the first embodiment but differs in that a monitor camera 110 is used in place of the sensors 67. The monitor camera 110 is attached to a support rod 64 which extends vertically and is fastened at the lower end to the arm section 51. The camera 110 is to monitor how the forks 59a and the fork 59b are moved back and forth. As shown in FIG. 14, the monitor camera 110 comprises a main body 111 and an illumination unit 112. The unit 112 is contained in the main body 111 and has its light-applying window formed in one side of the housing 111. Referring back to FIG. 13, the monitor camera 110 is electrically connected to an image-processing unit 115. The unit 115 is connected to a main controller 63 and also to a display 116. The camera 110 is positioned as to catch, in its view field, not only each fork but also at least a part of each wafer W contained in the wafer carrier C. More precisely, as shown in FIG. 15, the camera 110 is positioned such that its optical axis is inclined to a horizontal plane by an angle $\theta_A$ of, for example, 30° and that the axis as projected on a horizontal plane overlaps the axis of the fork.

Figure 16:
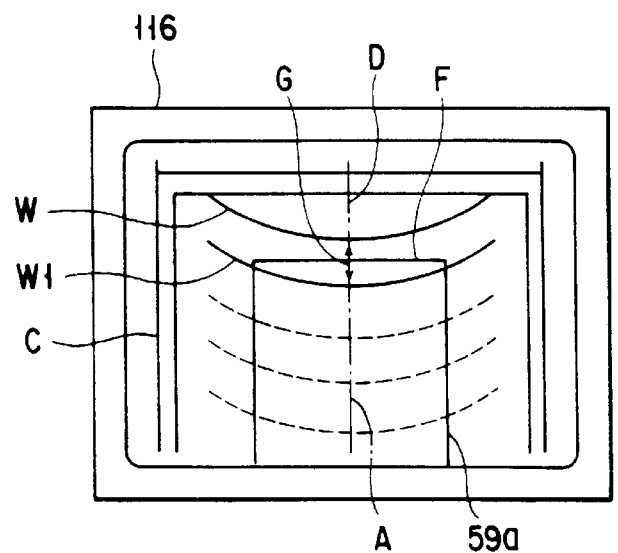
FIG. 16 is a schematic view showing the image displayed on the screen of the display connected to the monitor camera.

Since the monitor camera 110, so positioned, is connected to the image-processing unit 115 which in turn is connected to the display 116, the display 116 displays the image of each fork being moved into and from the wafer carrier C. Seeing the image of each fork thus displayed, an operator can understand how the fork is approaching the carrier C and moving away therefrom. As shown in FIG. 15, the monitor camera 110 is directed to the front of the wafer carrier C. Hence, when the fork 59b, for example, approaches the carrier C as to remove the uppermost wafer W from the carrier C, the display 116 displays the front edges of the wafers W contained in the carrier C and spaced apart one above another, as illustrated in FIG. 16. From the front edges of the wafers W thus displayed the operator can judge whether or not the carrier C supports the wafers W in the desirable condition.

From the image the display 116 displays as shown in FIG. 16, the operator can also judge whether or not the fork 59b is approaching the target wafer W in an appropriate direction. To be more specific, the operator can confirm whether or not the line A along which the fork 59b is moving aligns with the diameter D of the target wafer W. If the line A does not align with the line D, the operator can then know how the fork 59b is displaced with respect to the wafer W. The lines A and D will of course align with each other if the arm section 51 is set in the appropriate position (its tip opposing the wafer carrier C).

When the fork 59b is moved to have its front side F located at the position T (FIG. 15), the operator can understand how much the fork 59b is spaced from the target wafer W in the vertical direction. This is because the operator can see, on the screen of the display 116, the positional relation between the front side F of the fork 59b and the edge of the wafer W. More specifically, if the front side F of the fork 59b displayed is located at the midpoint in the gap G between the uppermost wafer W and the second uppermost wafer W1 as is illustrated in FIG. 16, the operator confirms that the fork 59b can be smoothly inserted into the gap between the wafers W and W1.

Thus the operator can know, at a place remote from the transfer apparatus 20, how any fork of the transfer apparatus 20 is moved to remove a wafer W from the wafer carrier C, by looking at the images of the fork and the wafer W which the monitor camera 110 scans and which the display 116 displays.

Since the monitor camera 110 is located high above the arm section 51, it can scan any fork, the wafer carrier C, and a wafer boat—during the period the fork is moved to transfer a wafer W to the wafer boat and to transfer the heat-treated wafer W from the boat to the carrier C. Hence, the display 116 keeps displaying the various positional relations which the fork and the wafer W assume during said period. Monitoring the changing positional relation between the fork and the wafer W, the operator can understand how the fork is moved, transferring the wafer W from the wafer boat to the wafer carrier C.

Unless the operator sees that the image of the fork is displaced with respect to the carrier C or the boat, the operator can confirm that the transfer apparatus 20 is operating in the prescribed pattern. In addition, the monitor camera 110, the image-processing unit 115, and the display 116 enable the operator to perform teaching on the transfer apparatus 20 without making an access into the apparatus 20. More specifically, the operator can perform the teaching at the upper and lower parts of the wafer carrier C and at the upper, middle and lower parts of the wafer boat, while seeing the images of the forks, the carrier C, and the boat being displayed by the display 116. The teaching data acquired is stored into the main controller 63.

When any fork is displaced too much with respect to the carrier or the wafer boat, the operator can know this fact from the image of the fork and that of the boat, both displayed by the display 116. Whether the displacement is tolerable or not can be determined by detecting whether or not it falls within a predetermined range stored in the main controller 63.

The main controller 63 is identical in structure to the main controller which is incorporated in the first embodiment. The data the image-processing unit 115 has produced by processing the signals output by the monitor camera 110 is input to the main controller 63. The controller 63 generates control signals, which are supplied to the transfer apparatus 20, controlling the same.

Controlled by the control signals generated from the signals output by the monitor camera 110, the transfer apparatus 20 shown in FIG. 13 transfers wafers W sequentially between the wafer carrier c and the wafer boat, exactly in the same way as the first embodiment (FIGS. 3 to 5) operate under the control of the signals generated from the sensors 76.

As has been described, the operator adjusts the basic operating pattern of the transfer apparatus is adjusted thereby to position any one of the forks appropriately, before the apparatus is actually operated. The apparatus can therefore arrange a wafer in, and remove it from, the carrier and the boat, both smoothly and reliably.

The operator can adjust the operating pattern of the transfer apparatus even after the apparatus has started operating, if the operator finds it necessary to do so, judging from the positional relation between any fork and the wafer carrier or between the fork and the wafer boat, which is monitored by the camera 110 and displayed by the display 116. In other words, the operator can adjust the operating pattern whenever the operator finds, on the screen of the display 116, that any fork is displaced too much with respect to the carrier or the boat.

The display 116 can be located at any place, provided it is connected to the monitor camera 110 via the image-processing unit 115. Hence, it can be installed remote from the heat treatment apparatus incorporating the transfer apparatus 20, and the operator need not be stationed near the heat treatment apparatus. Further, using the monitor camera 110, the image-processing unit 115, and the display 116, higher reliability can be obtained if the operator look into the heat treatment apparatus.

It is desirable that an image-recording apparatus, such as a video tape recorder, be connected to the monitor camera 110 for recording how the transfer apparatus 20 performs its function. The recorded video tape may be played back to see, in detail, how the apparatus 20 has operated. In case of an accident, such as the falling of a wafer or the toppling of the wafer boat, happens, then the cause of the accident can be analyzed from the recorded video tape in an effort to prevent a similar accident from occurring again. If no accident has happened, rendering it unnecessary to play back the recorded video tape, the tape can then be used to record how the apparatus 20 will perform the next wafer-transferring operation.

The monitor camera 110 may be a smaller one. If this is the case, the camera 110 can be located either at the position best possible to monitor the wafer-transferring operation or in a limited space into which the operator's eye cannot reach. If so located, the monitor camera 110 helps the operator to observe how the wafer is being transferred and ultimately enables the operator to adjust or rectify the operating pattern of the transfer apparatus 20 more accurately, thereby to improve the reliability of the apparatus 20. The camera 110 better assists the operator in adjusting the operating pattern of the apparatus 20 if the camera 110 has an image-magnifying device such as a zooming mechanism.

The transfer apparatus 20 may have two or more monitor cameras positioned at different positions. In this case, the wafer-transferring operation can be monitored from different angles and, hence, more accurately analyzed.

The present invention is not limited to the embodiments described above. For instance, the arm section 51, the forks 59a, the fork 59b, and the mechanism for driving the forks 59a and 59b may be replaced by any other types. Further, the wafer carrier and the wafer boat may be replaced by wafer supports of any other types.

Moreover, the present invention can be applied to an apparatus for transferring plate-like substrates other than semiconductor wafers, such as LCD (liquid crystal display) substrate or the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A transfer apparatus in a vertical heat treating system, said vertical heat treating system comprising,
    a container placing section for placing a container in said system, said container holding a plurality of substrates in a stacked state with a distance therebetween,
    a heat treating furnace for applying a heat treatment to said substrates, while said substrates are held by a boat in a stacked state with a distance therebetween, and
    a boat transport mechanism for transporting said boat between a position in said heat treating furnace and a transfer section outside said heat treating furnace,
    said transfer apparatus comprising:
    (a) a transfer unit for transferring said substrates from said container placed in said container placing section into said boat placed in said transfer section, said transfer unit having,
        (i) a base arranged to be vertically movable and rotatable within a horizontal plane, and
        (ii) a plurality of support members arranged on said base to be movable back and forth, for respectively supporting said substrates in a stacked state with a distance therebetween; and
    (b) a monitoring mechanism for monitoring movement of said support members, said monitoring mechanism having,
        (i) a camera attached to said base to be located at a position above proximal portions of said support members, and having a field of view whose optical axis is inclined downward to face a side to which said support members are moved forward, wherein said camera is arranged such that front ends of said substrates in said container are disposed in said field of view to observe said front ends one above another and to observe a positional relationship between said front ends and said support members, when said substrates in said container placed in said container placing section are taken out by said support members, and
        (ii) a display for displaying data obtained by said camera.

2. The apparatus according to claim 1, further comprising control means for controlling said base and said support members in accordance with data supplied from said monitoring mechanism.

3. The apparatus according to claim 2, wherein said control means allows said transfer unit to continue to operate when said positional relationship falls within a predetermined tolerance preset in said control means.

4. The apparatus according to claim 3, wherein said control means stops operation of said transfer unit when said positional relationship falls outside said predetermined tolerance preset in said control means.

5. The apparatus according to claim 1, further comprising an illumination member integrated with said camera.

6. The apparatus according to claim 1, wherein said substrates are semiconductor wafers.

7. A vertical heat treating system, comprising:
    (a) a container placing section for placing a container in said system, said container holding a plurality of substrates in a stacked state with a distance therebetween;
    (b) a heat treating furnace for applying a heat treatment to said substrates, while said substrates are held by a boat in a stacked state with a distance therebetween;
    (c) a boat transport mechanism for transporting said boat between a position in said heat treating furnace and a transfer section outside said heat treating furnace, and
    (d) a transfer unit for transferring said substrates from said container placed in said container placing section into said boat placed in said transfer section, said transfer unit having,
        (i) a base arranged to be vertically movable and rotatable within a horizontal plane, and
        (ii) a plurality of support members arranged on said base to be movable back and forth, for respectively supporting said substrates in a stacked state with a distance therebetween; and (e) a monitoring mechanism for monitoring movement of said support members, said monitoring mechanism having,
  (i) a camera attached to said base to be located at a position above proximal portions of said support members, and having a field of view whose optical axis is inclined downward to face a side to which said support members are moved forward, wherein said camera is arranged such that front ends of said substrates in said container are disposed in said field of view to observe said front ends one above another and to observe a positional relationship between said front ends and said support members, when said substrates in said container placed in said container placing section are taken out by said support members, and
  (ii) a display for displaying data obtained by said camera.

8. The system according to claim 7, further comprising control means for controlling said base and said support members in accordance with data supplied from said monitoring mechanism.

9. The system according to claim 8, wherein said control means allows said transfer unit to continue to operate when said positional relationship falls within a predetermined tolerance preset in said control means.

10. The system according to claim 9, wherein said control means stops operation of said transfer unit when said positional relationship falls outside said predetermined tolerance preset in said control means.

11. The system according to claim 7, further comprising an illumination member integrated with said camera.

12. The system according to claim 7, wherein said substrates are semiconductor wafers.

* * * * *